United States Patent [19]

Toida

[11] 4,096,476

[45] Jun. 20, 1978

[54] READING SYSTEM FOR A CODE DISK ANALOG-TO-DIGITAL CONVERTER AND AN ABSOLUTE VALUE DETECTOR

[75] Inventor: Ryuji Toida, Nagoya, Japan

[73] Assignee: Okuma Machinery Works Ltd., Nagoya, Japan

[21] Appl. No.: 720,139

[22] Filed: Sep. 3, 1976

[30] Foreign Application Priority Data

May 13, 1976 Japan .................................. 51-54618

[51] Int. Cl.² .................. G08C 9/04; H03K 13/02
[52] U.S. Cl. ................................................ 340/347 P
[58] Field of Search ...... 340/347 P, 347 SY, 347 AD, 340/357; 318/660, 659, 661, 569, 600

[56] References Cited

U.S. PATENT DOCUMENTS

| | | | |
|---|---|---|---|
| 3,473,098 | 10/1969 | Waller .................. | 318/660 |
| 3,478,346 | 11/1969 | Narukiyo ............... | 340/347 P |
| 3,603,978 | 9/1971 | Narukiyo ............... | 340/347 P |

Primary Examiner—Thomas J. Sloyan
Attorney, Agent, or Firm—Jay L. Chaskin

[57] ABSTRACT

A reading system for a hybrid A-D converter having, in combination, code disk A-D converters for converting an analog quantity such as a rotation angle or the like into a digital quantity and a neighborhood absolute value detector such as an inductosyn, a resolver or the like for providing the absolute value of a rotation within a small range thereof to, thereby extend the neighborhood absolute value region. Each of the code disk A-D converters supplies an output signal $l$ and a carry signal $Cr(1)$ which is generated depending on whether an output signal from a lower order code disk A-D converter is included in a predetermined upper group to a corresponding one of the logical circuits which are provided so as to correspond in number to the code-disk A-D converters. The logical circuit performing the logical operation $L = l \cdot (Cr \cdot \overline{l-1} + \overline{Cr} \cdot l + 1)$ provides a signal representative of one digit whereby the outputs from the A-D converters are prevented from errors upon carrying. The neighborhood absolute value detector supplies a carry signal $Cr(2)$ depending on whether the neighborhood absolute value is included in the predetermined upper group. The carry signal $Cr(2)$ and the inverted signal $\overline{Cr(2)}$ of the carry signal $Cr(2)$ are adapted to be supplied to the logical circuit in time-sharing relation to the carry signal $Cr(1)$ and the inverted signal $\overline{Cr(1)}$ of the carry signal $Cr(1)$.

4 Claims, 17 Drawing Figures

BLOCK DIAGRAM OF A READING SYSTEM FOR READING THE NEIGHBORHOOD ABSOLUTE VALUE OF AN INDUCTOSYN

$$d = (10^3 d_5 + 10^2 d_4 + 10 d_3 + d_2) \times 4{,}000 + d_1$$

READING SYSTEM FOR A CODE DISK ANALOG-TO-DIGITAL CONVERTER AND AN ABSOLUTE VALUE DETECTOR

FIELD OF THE INVENTION

The present invention relates to a hybrid A-D converter having in combination code disk A-D converters each of which converts an analog quantity such as a rotation angle or the like into a digital quantity and a neighborhood absolute value detector such as an inductosyn, a resolver or the like which provides the absolute value of a rotation within a small range of one period or one rotation to, thereby extend the neighborhood absolute value region.

DETAILED DESCRIPTION

In general, a code disk, forming the main part of an A-D converter is subject to being erroneously read at boundaries between adjacent digits on the code disk. In this connection, there have been some A-D converters such as, for example, disclosed in Japanese Patent Publication No. 992/67 entitled "A reading system for an A-D converter" and in U.S. Pat. No. 3,603,978 entitled "None-ambiguous reading systems for analog-to-digital converters". In order to more clearly understand to the present invention, the details of this prior art will be described.

Consider for example an A-D converter for providing 10 digits (decimal) of signals per rotation of a rotor shaft. If two code disks are used, and the rotor shafts are coupled together with a gear ratio of 10 : 1, the input shaft can provide 100 digits. In this case, when the lower order shaft is at the boundary between "9" and "0", the higher order shaft should be at the boundary between adjacent digits, and the change of the higher order shaft by one digit and the change of the lower order shaft from "9" to "0" should be coincident in position with regard to time. However, it is generally impossible to accomplish this coincidence because of mechanical inaccuracy, and erroneous signals are apt to occur. For example, erroneous signals such as "17", "18", "19", "10", "20", "21" may occur on rotation of the input shaft. The prior art relates to reading systems for preventing such an error from occurring. That is, in these reading systems, signals which are successively overlapped in the sense of rotation and are representative of necessary digits are picked up to be supplied to a logic circuit performing, for example, the logic operation $L = l(Cr \cdot \overline{l-1} + \overline{Cr \cdot l+1})$ so that erroneous signals may be prevented from occurring. The above-described logical circuit seek to prevent erroneous signals from occurring and so its logical operation is not limited to the above-mentioned one.

Figure 1:
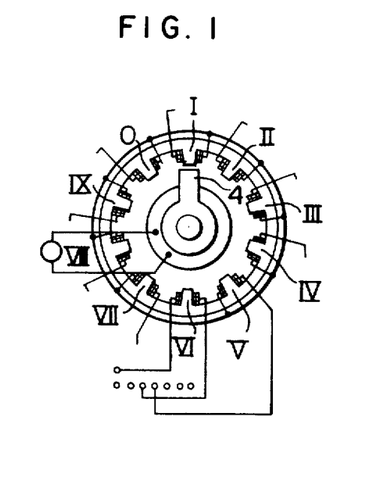
FIG. 1 is a view showing a decimal code disk.
Figure 2:
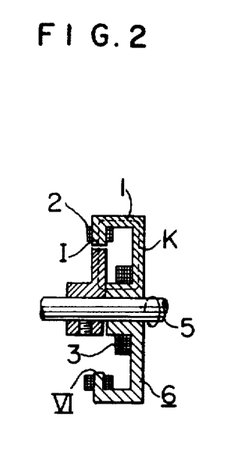
FIG. 2 is a longitudinal sectional view of the disk shown in FIG. 1.
Figure 3:
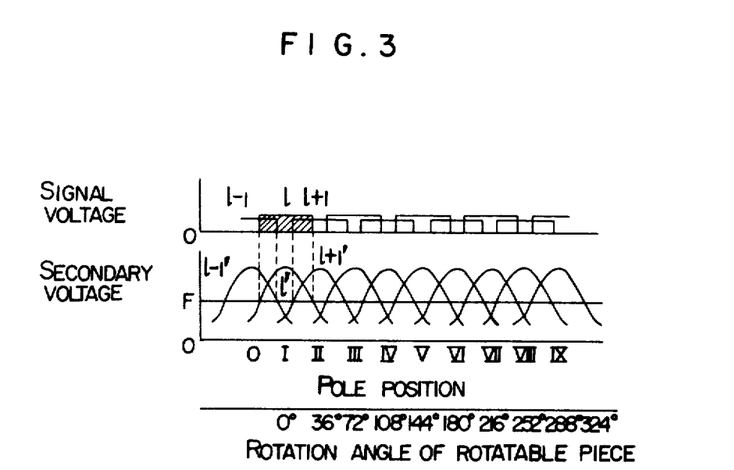
FIG. 3 is a graph showing the relation between an angle of relative rotation of a movable piece and a secondary voltage induced therein.
Figure 4:
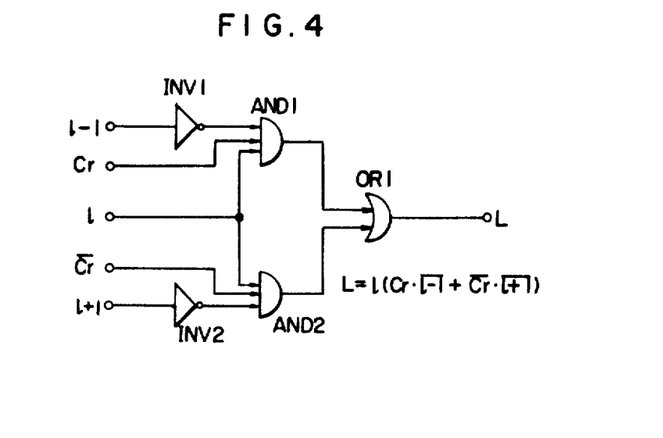
FIG. 4 is a block diagram of a logical circuit according to the present invention.

Referring to FIGS. 1 and 2 reference numeral 1 designates poles which are uniformly spaced along the outer periphery of a stator 6 and extend inwardly towards the center and, numeral 2 designates secondary coils wound around the poles 1. Numeral 3 designates a primary coil wound around a boss of the stator 6, and numeral 4 designates a rotatable piece which is fixed to a rotating shaft 5 and is in the shape of a tongue having a circumferential width larger than that of each pole. The rotating shaft 5 passes through the center of the stator 6. The decimal code disk having such a transformer structure operates as a pulse transformer. When the primary coil 3 is pulse-energized and the shaft 5 is rotated, with the piece 4 successively passes in front of poles 1 each carrying the secondary coil 2. A magnetic circuit K completed at a position corresponding to each pole as shown in FIG. 2, and peak value voltages are successively induced by the transformer action in the secondary coils as shown in FIG. 3 by $l-1', l', ll' \ldots$, which overlap one another with respect to the sense of rotation angle. These voltages are introduced into a shaping circuit such as a Schmidt trigger circuit to provide successively overlapping signals $l-1, l, l+1 \ldots$, as shown in FIG. 3, with a line F as the operating line. These signals are introduced into the logical circuit shown in FIG. 4. In FIG. 4, AND 1 and AND 2 are AND circuits. and INV 1 and INV 2 are inverters. The symbols $l-1$, $l$, and $l+1$ reprsent any successive digital signals (such as 0, 1, 2; 5, 6, 7; 9, 0, 1 and the like) which are obtained by shaping the output of each pole of the higher order code disk as shown in FIG. 3. The symbols $\overline{l-1}$ and $\overline{l+1}$ represent inverted signals of $l-1$ and $l+1$, respectively. $Cr$ and $\overline{Cr}$ represent carry signals from the lower order code disk and are arranged to be generated when the lower order digits are 5 to 9 and 0 to 4, respectively. The reason for this representation is to provide for a tolerance of the coupling error between the higher order digits and the lower order digits larger.

Figure 5:
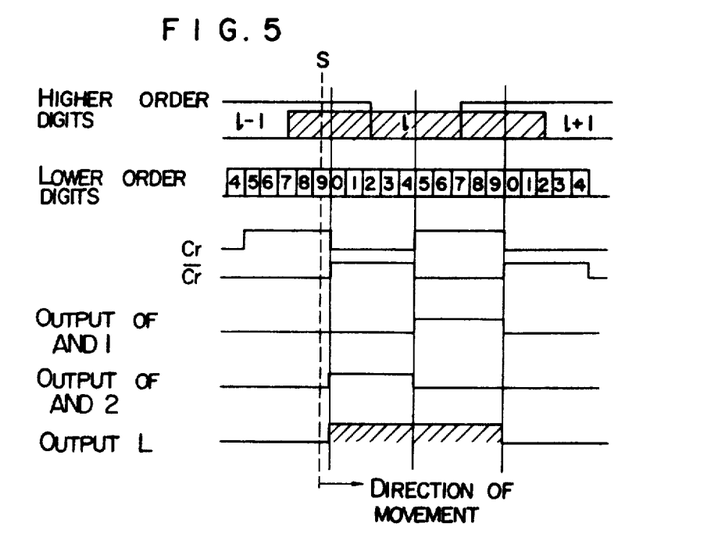
FIG. 5 is a graph showing wave forms at various parts of the logical circuit of FIG. 4.

As an example, assuming that the outputs from the poles O, I, and II are $l-1$, $l$, and $l+1$, respectively. As shown in FIG. 3, $Cr$ and $\overline{Cr}$ are arranged to be generated when the lower order digits are 5 to 9 and 0 to 4, respectively, and the rotatable piece shown in FIG. 1 is moved in the increasing number direction. The digit signal of the pole I is read, and the wave forms at various parts of the logical circuit shown in FIG. 4 change in time as shown in FIG. 5. In FIG. 5, character S represents the position of the rotatable piece 4 of the higher order A-D converter. It is assumed that the output of the lower figure or order A-D converter is 9 and the higher figure or order converter is delivering both signals $l-1$ and $l$. The above-mentioned logical equation L is the logical operation for reading out the output $l$ of the higher order converter. Since the signal $Cr$ as well as the signal $l-1$ is being delivered at the position S, the equation L is not satisfied. When the rotatable piece 4 moves in the increasing number direction and the lower order digit changes from 9 to 0, the signal $Cr$ disappears, and instead the signal $\overline{Cr}$ appears. Consequently, the output from the AND 2 $l\cdot\overline{Cr}\cdot\overline{l+1}$ in the logical circuit shown in FIG. 4 is satisfied resulting in the generation of the signal. Since $l\cdot\overline{Cr}\cdot\overline{l+1}$ is satisfied, the logical equation $L = l\,(Cr\cdot\overline{l-1} + \overline{Cr}\cdot\overline{l+1})$ is satisfied as the lower order digit changes from 9 to 0. If the rotatable piece moves further and the lower order digit changes from 4 to 5, the signal Cr appears, and hence the term $l\cdot\overline{Cr}\cdot\overline{l+1}$ of the logical equation of the signal L which has been satisfied is no longer satisfied. However, since $l\cdot Cr\cdot\overline{l-1}$ of the AND 1 is satisfied because of the appearance of the signal $Cr$, the logical equation L is still satisfied and the signal is maintained. If the lower order digit changes from 9 to 0 with a further movement of the rotatable piece, the signal Cr disappears and hence the term $l\cdot Cr\cdot\overline{l-1}$ of L which has been satisfied is no longer satisfied while the signal $l+1$ as well as $\overline{Cr}$ appears and hence also the term $l\cdot\overline{Cr}\cdot\overline{l+1}$ is not satisfied. Thus, all the terms of the logical equation are no longer satisfied. That is, if the lower order digit changes from 9 to 0, the logical equation L is not satisfied in its entirety and the signal disappears. Thus, as is evident from FIG. 5, the logical equation of the signal L is satisfied from the time when the lower order digit becomes 0 until the time when it becomes 9 within the region of the signal $l$, and hence the output signal L of the logical circuit shown in FIG. 4 exactly represents the position of the pole I. FIG. 4 shows the logical circuit for reading out according to the afore-mentioned logical equation the signal of the pole I of the higher order A-D converter. For decimal purposes, the position of each pole of the A-D converter can be readily read out by employing ten such logical circuits as shown in FIG. 4.

Figure 6:
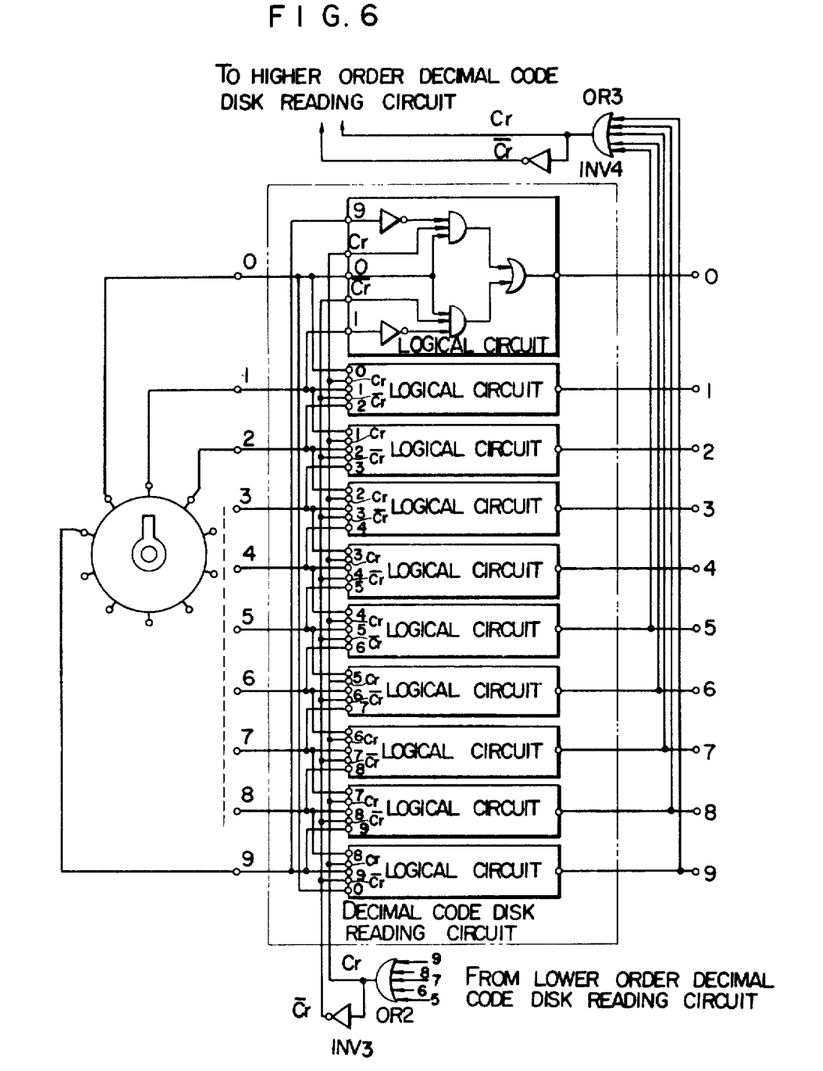
FIG. 6 is a block diagram of a reading circuit for a decimal code disk.

FIG. 6 shows a decimal code disk reading circuit which is formed of 10 such logical circuits shown in FIG. 4.

Figure 7:
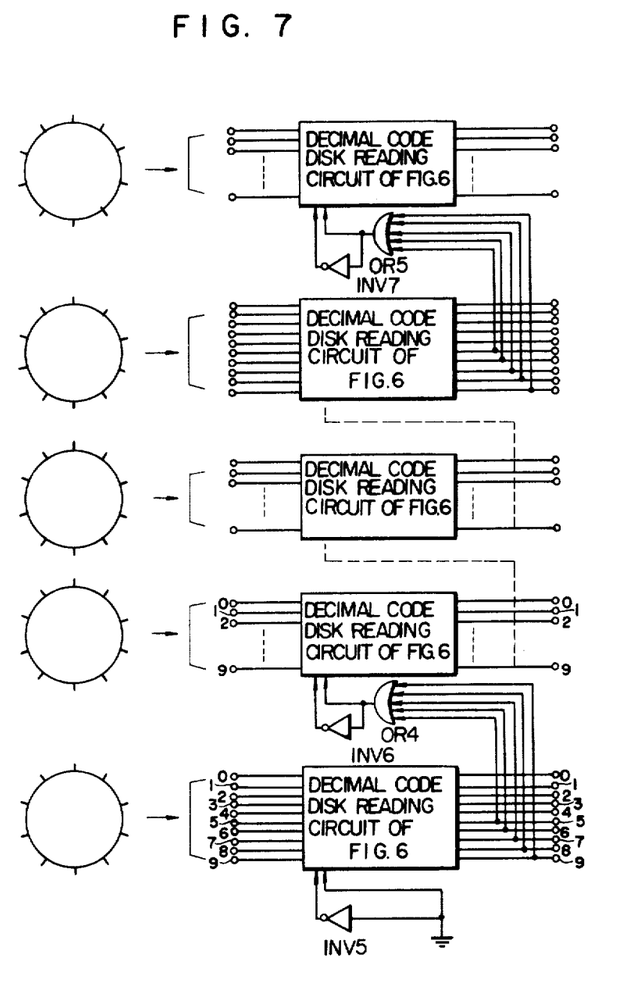
FIG. 7 is a block diagram of a reading system for reading five-decimal code disks.

FIG. 7 shows a reading system for reading out five digits corresponding to five decimal code disks, which has five such decimal code disk reading circuits shown in FIG. 6 connected with each other. Thus, if the number of decimal code disks increases, the whole logical circuit for reading the digits becomes correspondingly complicated and expensive.

Figure 8:
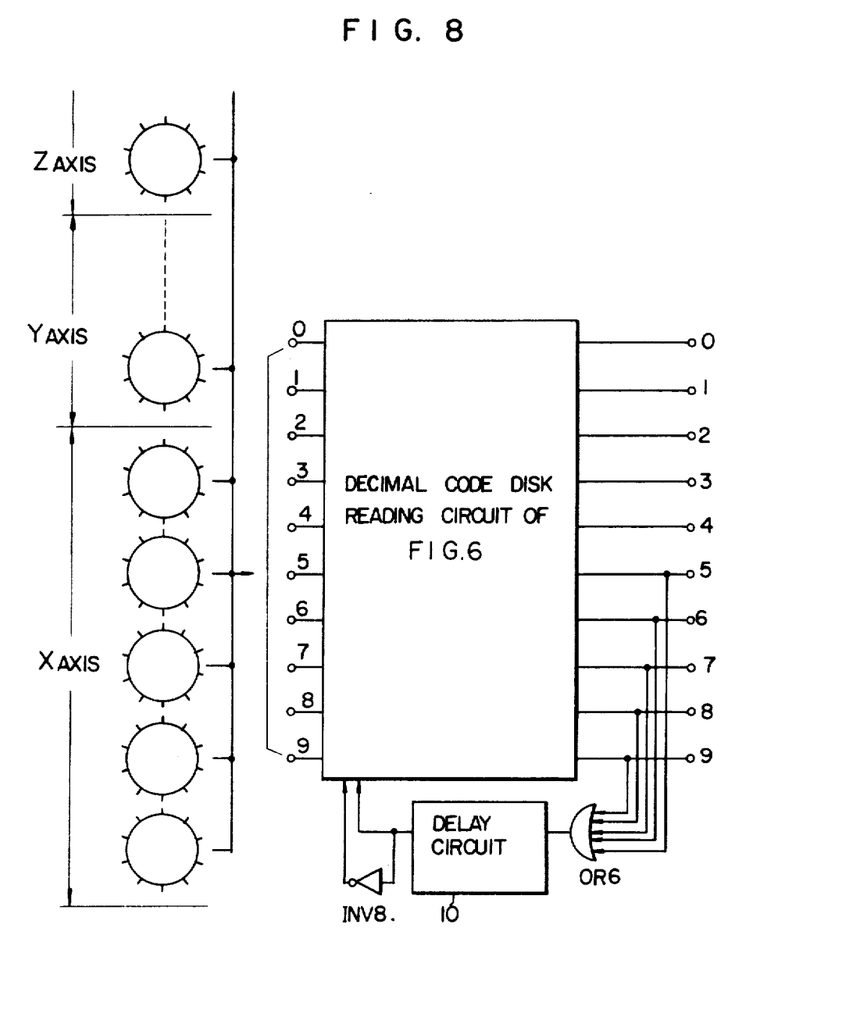
FIG. 8 is a block diagram of a reading system for reading in time-sharing operation a plurality of orders of decimal code disks.

FIG. 8 shows a reading system for reading a number of digits corresponding to a plurality of decimal code disks in a time-sharing manner, in which the reading can be effected with only one such decimal code disk reading circuit shown in FIG. 6 by employing a time-sharing technique. The decimal code disk reading circuit shown in FIG. 6 is successively switched, first on X axis, from the lowest order code disk to the next higher order code disk, and to the further higher order code disks, next in a same manner on Y and Z axes, then again on X axis and so with a train of timing pulses with intervals of, for example, 20 $\mu$S. A time sharing technique for this purpose is described, for example, in Japanese Patent Publication No. 12400/68 entitled "Numerical Control System".

As described hereinbefore, in particular, with respect to Japanese Patent Publication No. 992/67 entitled "A reading system for an A-D converter" and U.S. Pat. No. 3,603,978 entitled "None-ambiguous reading system for analog-to-digital converters", the decimal code disk reading circuit is required to be supplied with the carry signals $Cr$ and $\overline{Cr}$ from the lower order and hence, as long as the same decimal code disk is employed at the lower order, can easily get the carry signals. However, if a neighborhood absolute value detector such as an inductosyn, a resolver or the like is attempted to be employed at the lower order, the carry signals cannot be supplied and thus the decimal code disk cannot be operatively coupled with the neighborhood absolute value detector.

An object of the present invention is to provide a reading system for a hybrid A-D converter in which the decimal code disks and the neighborhood absolute value detector are coupled by providing a carry signal generating means for the neighborhood absolute value detector whereby the range of the neighborhood absolute value can be extended. A further object of this invention is to provide a reading system for a hybrid A-D converter which makes it possible to detect an absolute value for all positions of and with the high precision of an inductosyn, especially when the neighborhood absolute value detector is an inductosyn.

The reading system for a hybrid A-D converter according to the present invention has decimal code disks and a neighborhood absolute value detector other than the code disk such as an inductosyn, a resolver, an optical encoder or the like coupled with each other thereby to make possible extension of the absolute value range. In particular, when the neighborhood absolute value detector is an inductosyn, the absolute value can be detected with high precision and through all the positions thereof, and thus both the detector and the peripheral circuit are made to be inexpensive. Further the detector can be simplified as compared with a three speed, that is, coarse, medium and fine, inductosyn system according to the prior art. Further, when the neighborhood absolute value detector is a resolver, among others, one resolver can replace three or more decimal code disks, as it is possible to make one resolver correspond to more than three resolvers. Thus, both the detector and the peripheral circuit effectively very inexpensive as compared with a three speed resolver system according to the prior art.

Figure 9:
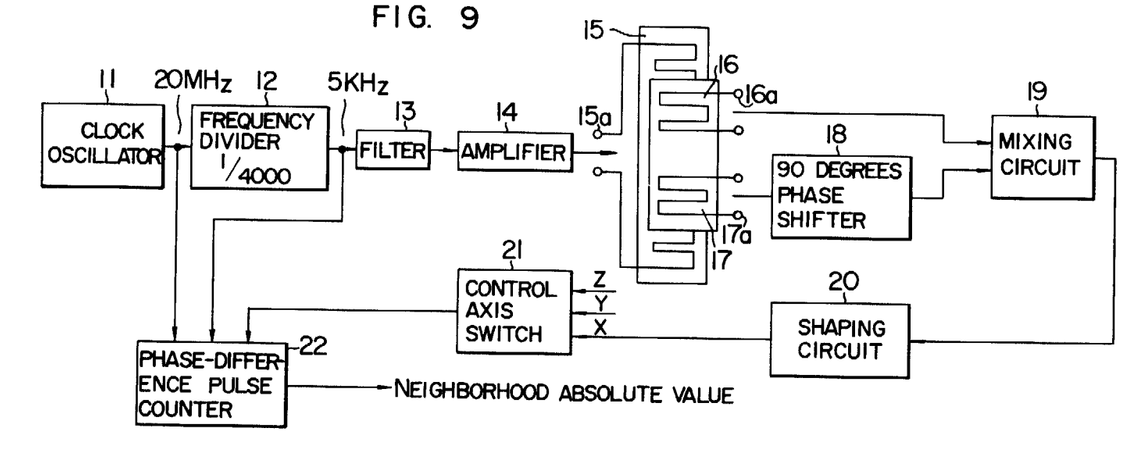
FIG. 9 is a block diagram of a reading system for reading the neighborhood absolute value of an inductosyn.
Figure 10:
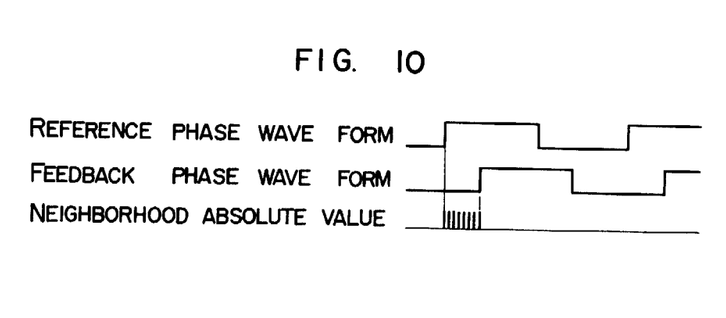
FIG. 10 is a graph showing the relationship among a reference phase wave form, a feedback phase wave form, and a neighborhood absolute value.

In an embodiment of the present invention, an inductosyn is employed as the neighborhood absolute value detector. The inductosyn is, in general, a detector having a period of 2 millimeters in the millimeter system or a period of 0.1 inches in the inch system and detects an absolute value within the period. For the better understanding of the present invention, first of all, a reading system of neighborhood absolute value for the inductosyn will be described in conjunction with FIG. 9. In FIG. 9, reference numeral 11 designates a 20 MHz clock oscillator. Numeral 12 designates a 1/4000 frequency divider which supplies a square wave of 5 KHz. Numeral 13 designates a filter which takes out only a fundamental wave. Numeral 14 designates an amplifier, numeral 15 designates a scale side coil of the inductosyn which is mounted usually on the fixed side of a machine tool or the like, numeral 15a designates a scale side excitation terminal, numerals 16 and 17 designate slider side coils of the inductosyn which is mounted on the movable side of the machine tool or the like, and numerals 16a and 17a designate slider side output terminals. If it is assumed that a mechanical angle $\theta$ M is representative of a deviation within one pitch of the slider of the inductosyn, the outputs terminals 16a and 17a provide outputs which are exciting sine waves having amplitudes which are proportional to $\sin \theta$ M and $\cos \theta$ M and are in phase, respectively. One of the outputs, say the output from the coil 17, for example, is modulated through a 90° phase shifter 18 to have a phase difference of 90° and the outputs from the 90° phase shifter and the coil 16 are applied to a mixing circuit 19 which provides a phase-modulated wave. This wave is supplied to a shaping circuit 20 to be shaped from a sine wave into a square wave. The output from the shaping circuit 20 is supplied to a phase-difference pulse counter 22 when a control axis switch 21 selects a predetermined axis, say X axis, for example. In this embodiment, the inductosyn (15, 16 and 17), the 90° phase shifter 18, the mixing circuit 19, and the shaping circuit 20 serves to control the X axis. The phase-difference pulse counter 22 searches for the phase-difference between the reference phase, the output from the frequency divider 12, and the feedback phase, the output from the shaping circuit 20 through the control axis switch 21, and counts the output pulses from the clock oscillator 11 for the above-determined phase difference. The counter number of pulses is set to be a neighborhood absolute value. Thus, in this case, the phase difference represents an absolute scale having a period of 2 mm and one pulse of the output from the clock oscillator 11 corresponds to 0.5 $\mu$m. FIG. 10 represents the relationship among the reference phase wave form or the output from the frequency divider 12, the feedback phase wave form or the output from the shaping circuit 20, and the neighborhood absolute value or the number of pulses of the output from the clock oscillator 11 counted for the difference between the phases above.

Figure 11:
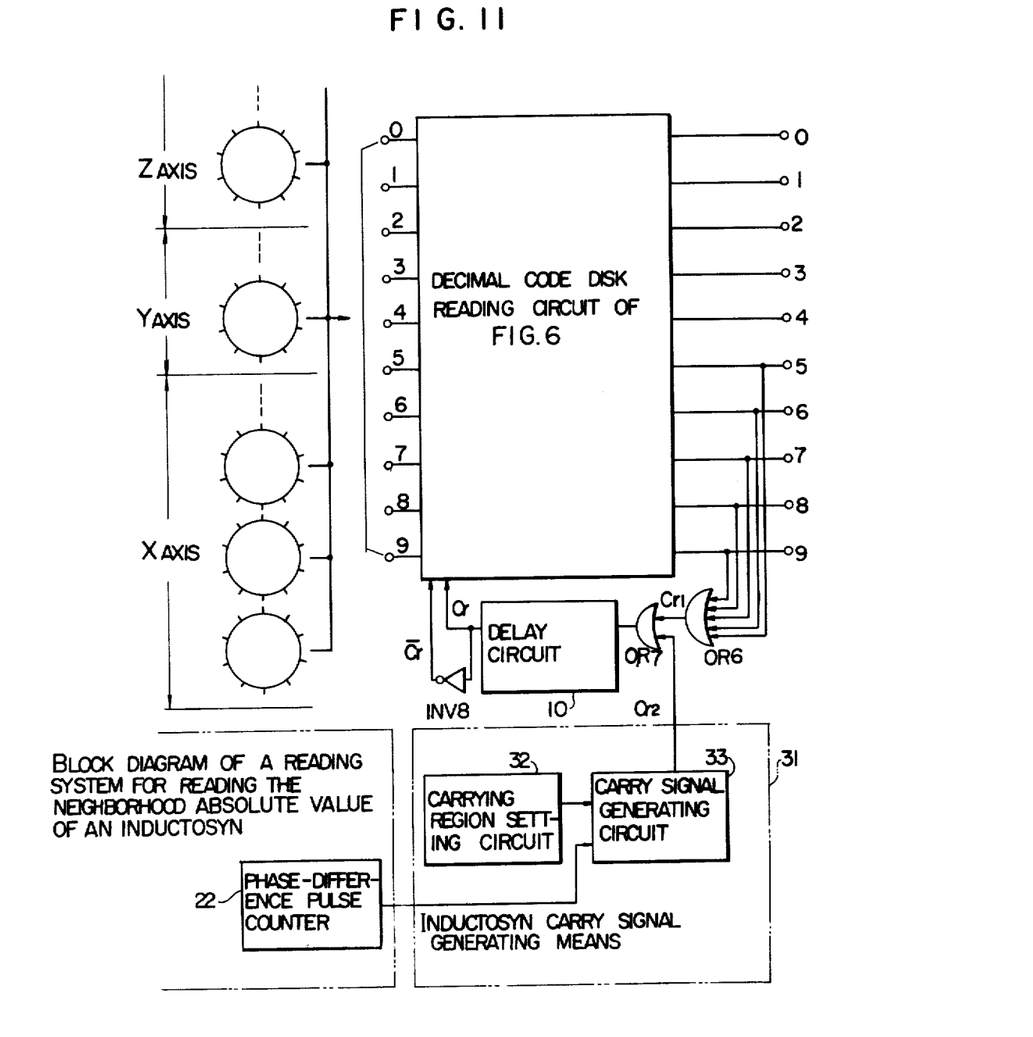
FIG. 11 is a block diagram of a reading system for a hybrid A-D converter, embodying the present invention, which comprises decimal code disks and an inductosyn coupled with each other.

FIG. 11 is a block diagram of a reading system for a hybrid A-D converter, embodying the present invention, which comprises the decimal code disks and the inductosyn coupled with each other. In FIG. 11, reference numeral 31 designates an inductosyn carry signal generating means which characterizes the present invention, and numeral 32 designates a carrying region setting circuit which sets the carrying region of an inductosyn used in the lower order. Numeral 33 designates a carry signal generating circuit which judges by using inequalities or the like whether a neighborhood absolute value supplied from the phase-difference pulse counter in the block diagram of a reading system for reading the neighborhood absolute value of an inductosyn shown in FIG. 9 is included in a region set by a carrying region setting circuit or not and, if included, generates a carry signal $Cr(2)$. Though the above-described inductosyn carry signal generating means 31 comprises the carrying region setting circuit 32 and the carry signal generating circuit 33, the setting function of the carrying region setting circuit may be included in the carry signal generating circuit 33. The output from the carry signal generating means 31, that is, the carry signal $Cr(2)$ is supplied through an OR circuit 7, a delay circuit 10 and an inverter 8 or the like to each of the logical circuits in the decimal code disk reading circuit. In this case, the carry signal $Cr(2)$ is supplied to each of the logical circuits in the decimal code disk reading circuit in a time-sharing manner with the carry signal $Cr(1)$ in the case of a decimal code disk being used at the lower order.

Figure 12:
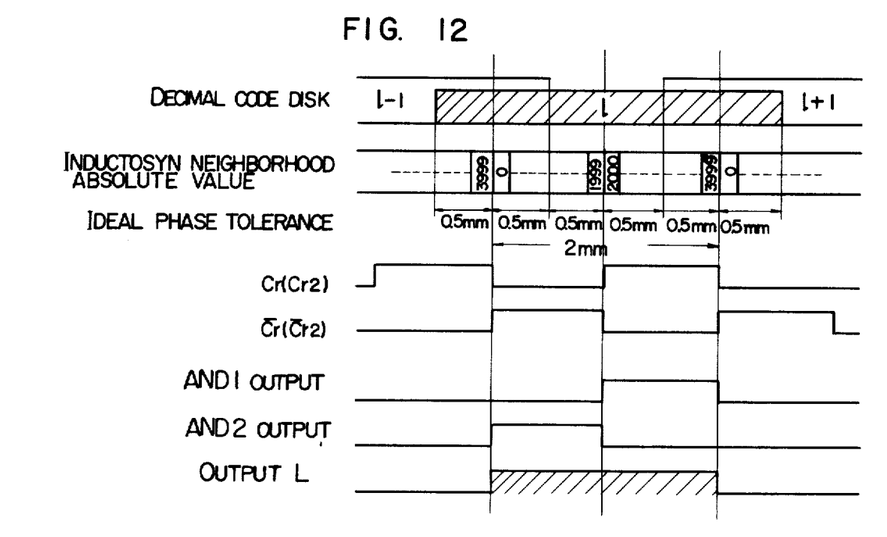
FIG. 12 is a graph showing wave forms at various parts of the logical circuits in a decimal code disk reading circuit when an inductosyn is employed at the lower order as shown in FIG. 11.

FIG. 12 shows wave forms at various parts of the logical circuits in a decimal code disk reading circuit when the inductosyn is employed at the lower order as shown in FIG. 11. In this case, the logical circuits are operated in such manner that one pitch of the inductosyn or 2 mm is coincident with one digit of the decimal code disk at the higher order. Consequently, the absolute value region of the decimal code disks is extended ten times to be 20 mm. Since, in FIG. 12, one pitch 2 mm of the inductosyn is equally divided into 4000 parts, the neighborhood absolute value ranges from 0 to 3999. Since the output wave form of the decimal code disk has a tolerance, the carry signal $Cr(2)$ is not required to be generated in the region of precisely half the pitch of 2 mm. However, usually the signal $Cr(2)$ is generated in the region of half the pitch, that is, the region of the neighborhood absolute value ranging from 2000 to 3999. The above-mentioned tolerance is ±0.5 mm in an ideal state. By setting such region with the carrying region setting circuit 32 shown in FIG. 11, the carry signal $Cr(2)$ can be generated from the carry signal generating means 31, that is, it is possible to couple the decimal code disk and the inductosyn. If the number of the decimal code disks are increased, the region of absolute value is further extended. Further, since the region set by the carrying region setting circuit can be in general considered to be fixed; in the actual mode of practice, when the phase-difference pulse counter is a decimal counter, it is possible to derive only one signal lead from the bit having weight of 2 in the position 1000 in the number which is represented in binary-coded decimal form, thereby to provide directly the carry signal $Cr(2)$. Thus, in this case, if the output from the phase-difference pulse counter 22 is 2000 to 3999, the carry signal $Cr(2)$ necessarily results. On the other hand, when the phase-difference pulse counter 22 is a pure binary counter, it is possible to derive only one signal lead from the twelfth bit order, thereby to provide directly the carry signal $Cr(2)$. In this case, the carry signal $Cr(2)$ is the inevitable output when the output from the phase-difference pulse counter 22 is 2048 to 3999. Here, the numerical value 2048 is the value associated to the twelfth bit order.

In these two modifications, the function of the counter and the selection of the signal lead perform, as they are coupled, the same role as the carrying region setting circuit and the carry signal generating circuit. Therefore, these modifications should naturally be considered to constitute embodiments of the present invention.

Figure 13:
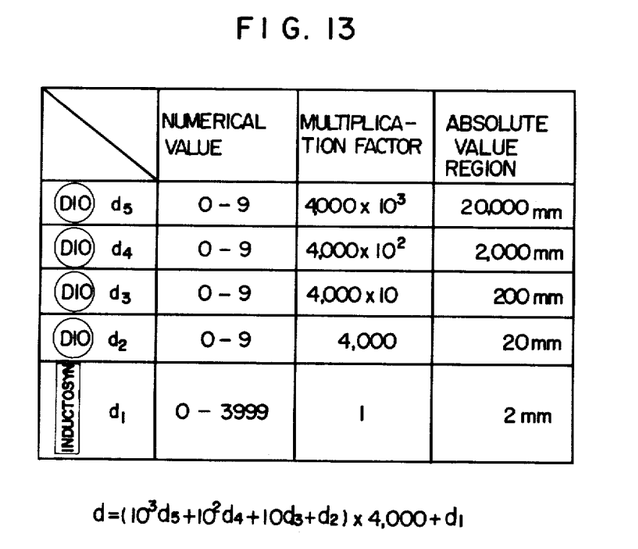
FIG. 13 is a table illustrating the relationship among a numerical value, a multiplication factor and an absolute value region at each order of a hybrid A-D converter comprising four-decimal code disks and an inductosyn coupled with each other.

FIG. 13 is a table illustrating the relationship among a numerical value, a multiplication factor and an absolute value region at each order of a hybrid A-D converter comprising four decimal code disks and an inductosyn coupled with each other. An output numerical value of the hybrid A-D converter is represented by $(10^3 d_5 + 10^2 d_4 + 10 d_3 + d_2) \times 4000 + d_1$ and the unit of this output numerical value is 0.5 μm which is one four thousandth of 2 mm. Further, $d_1$ to $d_5$ are the numerals on the inductosyn and the decimal code disks, respectively, and $D_{10}$ means the decimal code disk.

Figure 14:
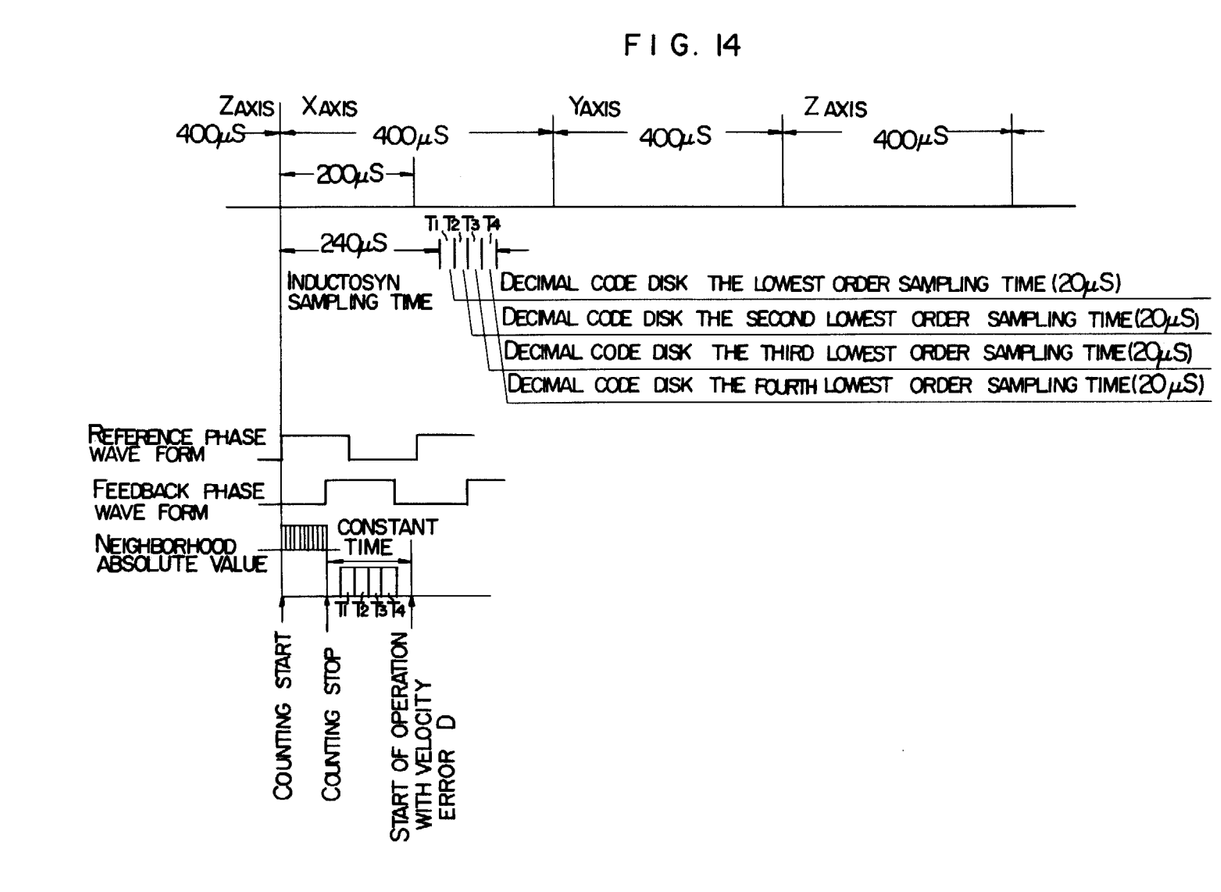
FIG. 14 is a graph showing the sampling time of each order of the hybrid A-D converter comprising four decimal code disks and an inductosyn coupled with each other.

FIG. 14 is a graph showing the sampling time of each order of the hybrid A-D converter comprising four decimal code disks and an inductosyn coupled with each other. Since the exciting frequency of the inductosyn is 5 KHz, an absolute value of 2 mm can be obtained within about 200 μS. However, since the frequency of the feedback phase-modulated wave deviates from the exciting frequency when the machine is in operation and there may be cases that the time exceeds 200 μS more or less, the sampling time of the inductosyn is set to be larger than 200 μS as shown in FIG. 14. The decimal code disks at the higher orders than the inductosyn are excited from $T_1$ and the higher orders are digitalized during $T_1$ to $T_4$. For example, the sampling of the X axis is completed within 400 μS. The exciting frequency is set to be 5 KHz in this example. However, since, in the system for reading the neighborhood absolute value shown in FIG. 9, higher exciting frequencies and clock frequencies as compared with the digital phase modulation system (DPM system) employed in numeral control technique can be used, it is also possible together with the rapid sampling capacity of the decimal code disks to provide an absolute value within 200 μS per one axis. Further, when the exciting frequency of the inductosyn is increased, the deviation of the frequency when the machine is in operation is reduced, and therefore, it is possible to detect the correct position. Further, it is possible to carry out sampling of the decimal code disks in synchronism with the feedback phase, and the operation with the velocity error D can be started after a certain constant time from the feedback phase. Here, there is a relation that the velocity error D = instantaneous command value − actual value, and the value D is D-A converted to control a servo-motor. When the least unit of the instantaneous command value in contouring control is sufficiently small, the variation in the velocity error D is reduced so that the motor can be well controlled. When, in addition, the sampling time is made to be short, it becomes possible to carry out the control which is improved in follow-up servo characteristics.

Figure 15:
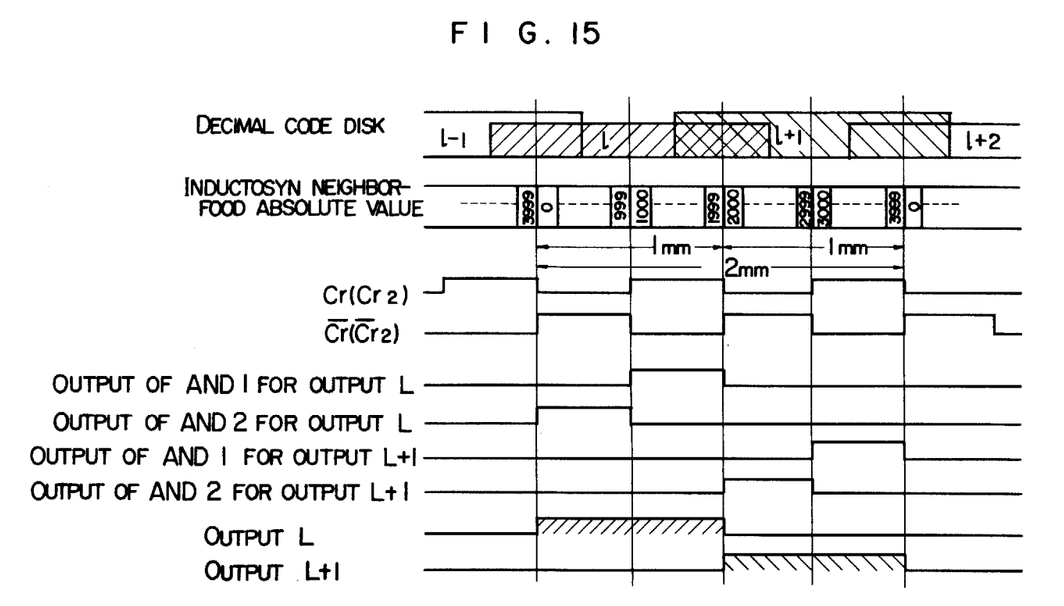
FIG. 15 is a graph showing wave forms at various parts of the logical circuit corresponding to FIG. 12 when half the pitch of the inductosyn or 1 mm is made to correspond to one digit on a decimal code disk.

FIG. 15 is concerned with an embodiment when a decimal display is made and the figure shows wave forms at various parts of the logical circuits in the decimal code disk reading circuit when the inductosyn is used at the lower order as in the case of FIG. 12. In this embodiment, the logic circuits are operated in such a manner that 1 mm, which is half the pitch of the inductosyn, is made to coincide with the length for one digit of the decimal code disk. As a result 10 mm, which is for 5 pitches of the inductosyn corresponds to one rotation of the decimal code disk and the absolute value region of the decimal code disk is extended 10 times to be 10 mm. Here, the carry signal $Cr(2)$ is set to be generated in the region of 1000 to 1999 and in the region of 3000 to 3999.

Figure 16:
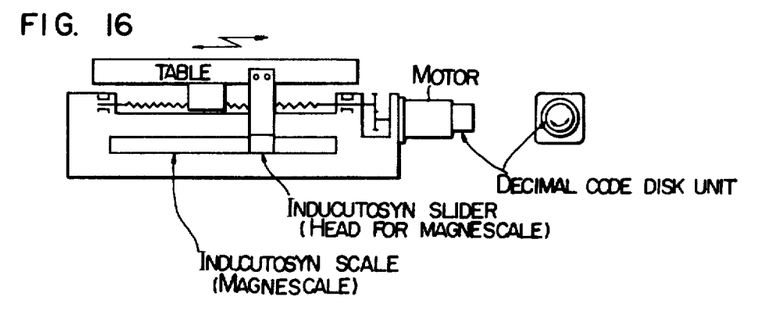
FIG. 16 is a schematic view of a hybrid A-D converter comprising a decimal code disk unit having a plurality of decimal code disks and an inductosyn or a magnescale coupled with each other.

FIG. 16 is a schematic view of a hybrid A-D converter comprising a decimal code disk unit having a plurality of decimal code disks and an inductosyn or a magnescale coupled with each other. The decimal code disk unit can be operated in the direction of the arrow to be in phase with the inductosyn or magnescale. In the alternative, the inductosyn or magnescale side can be operated for this purpose.

Hereinbefore, some embodiments of a reading system for a hybrid A-D converter comprising decimal code disks and an inductosyn coupled with each other were described. However, a resolver, magnescale, optical encoder or the like can be coupled instead of the inductosyn with the decimal code disks to extend the neighborhood absolute value region just in the same manner. The above-mentioned magnescale is the commercial name of a length and angle detector based on the principle of magnetic recording and manufactured by Sony Co., Ltd. in Japan. The scale of the magnescale is a grating-like magnetization pattern which is formed by applying a magnetic medium on a scale base and by recording on the resulting magnetic film a sinusoidal wave having a wavelength of 0.2 mm with a magnetic head.

Figure 17:
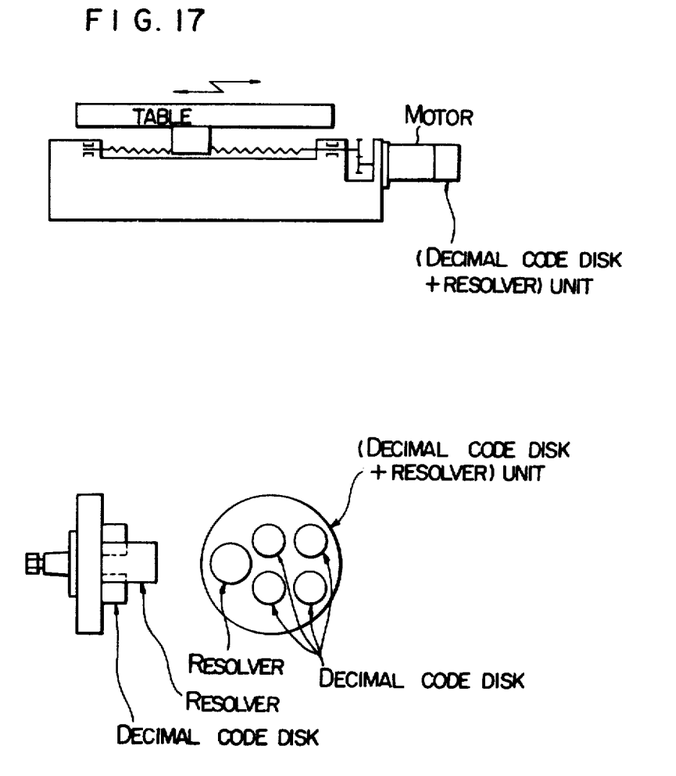
FIG. 17 shows schematically a hybrid A-D converter comprising four decimal code disks and a resolver integrally assembled together and its application.

FIG. 17 shows schematically a hybrid A-D converter comprising four decimal code disks and a resolver integrally assembled together and its application. When, in this case, one rotation of a two-pole resolver is made to correspond to 2 mm, it is possible to obtain an absolute value region of 20 m by coupling with four decimal code disks as shown in FIG. 17.

In addition, the code disk is not limited to be a decimal code disk but it may be, e.g., an octal code disk, and, in this case, pure binary processing can be performed. Further, of course, not only a linear inductosyn byt also a rotary inductosyn can be employed as the inductosyn.

Various modifications may be made by one skilled in the art to the disclosed embodiments of the invention without departing from the scope of the invention as defined by the claims.

What is claimed is:

1. A reading system for a hybrid A-D converter including at least two n-digits code disks, n being equal to or larger than three, and n logical circuits; any successive two of n output signals 0, 1, 2, ... n-1 from one of said n-digits code disks being generated so as to be overlapped with each other with respect to the rotation angle of said n-digits code disk; each of said n logical circuits performing the following logical operation, $$L = l \cdot (\overline{Cr \cdot l - 1} + \overline{Cr \cdot l + 1})$$

where, $l-1$, $l$, $l+1$ are any successive three of the n output signals from one of successive two code disks of said at least two n-digits code disks; $Cr(1)$ being a carry signal generated when one signal included in a group of larger numerical values of output signals from the lower order disk of said successive two code disks appear, and $\overline{Cr(1)}$, whereby each of said n logical circuits provides a signal representative of one digit, and a precise n-digits signal is obtained by said n logical circuits; said reading system comprises a neighborhood absolute value detector which is different from said $n$-digits code disks at low position, and a means which generates a carry signal $Cr(2)$ when a neighborhood absolute value from said neighborhood absolute value detector is employed instead of said output signals from the lower order code disk and one signal included in the group of larger numerical values of the neighborhood absolute value appears; said carry signal $Cr(2)$ and the inverted signal $\overline{Cr(2)}$ of said carry signal $Cr(2)$ being adaped to be supplied to said logical circuit in time-sharing relation to said carry signal $Cr(1)$ and the inverted signal $\overline{Cr(1)}$ of said carry signal $Cr(1)$.

2. A reading system for a hybrid A-D converter as claimed in claim 1, wherein said means for generating a carry signal comprises a carrying region setting circuit capable of setting a carrying region and a carry signal generating circuit responsive to the output from said carrying region setting circuit and said neighborhood absolute value as inputs for generating a carry signal.

3. A reading system for a hybrid A-D converter as claimed in claim 1, wherein said neighborhood absolute value detector is an inductosyn.

4. A reading system for a hybrid A-D converter as claimed in claim 1, wherein said neighborhood absolute value detector is a resolver.

* * * * *

UNITED STATES PATENT AND TRADEMARK OFFICE
CERTIFICATE OF CORRECTION

PATENT NO. : 4096476
DATED : June 20, 1978
INVENTOR(S) : RJUJI TOIDA

It is certified that error appears in the above–identified patent and that said Letters Patent are hereby corrected as shown below:

Claim 1, line 65 should read -- $\overline{Cr(1)}$ is an inverted signal of said carry signal $Cr(1)$, whereby each of said $n$ logical circuits provides a --

*Signed and Sealed this*

*Twenty-seventh* Day of *March 1979*

[SEAL]

Attest:

RUTH C. MASON
*Attesting Officer*

DONALD W. BANNER
*Commissioner of Patents and Trademarks*